(12) United States Patent
Jia et al.

(10) Patent No.: US 12,212,319 B2
(45) Date of Patent: Jan. 28, 2025

(54) POWER-ON-RESET CIRCUIT

(71) Applicant: Shanghai Huali Microelectronics Corporation, Shanghai (CN)

(72) Inventors: Yu Jia, Shanghai (CN); Yifei Qian, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 18/231,851

(22) Filed: Aug. 9, 2023

(65) Prior Publication Data

US 2024/0128976 A1    Apr. 18, 2024

(30) Foreign Application Priority Data

Oct. 18, 2022  (CN) .......................... 202211273910.8

(51) Int. Cl.
*H03K 19/0185*   (2006.01)
*H03K 17/22*     (2006.01)
*H03K 17/687*    (2006.01)

(52) U.S. Cl.
CPC ... *H03K 19/018521* (2013.01); *H03K 17/223* (2013.01); *H03K 17/6872* (2013.01)

(58) Field of Classification Search
CPC ......... H03K 19/018521; H03K 17/223; H03K 17/6872

USPC .......................................... 327/142, 143, 198
See application file for complete search history.

(56) References Cited

U.S. PATENT DOCUMENTS

| | | | | |
|---|---|---|---|---|
| 6,509,768 B2 * | 1/2003 | Polizzi | ................. | H03K 17/223 327/143 |
| 8,193,841 B2 * | 6/2012 | Sareen | ...................... | G06F 1/24 327/143 |

* cited by examiner

*Primary Examiner* — Menatoallah Youssef
*Assistant Examiner* — Colleen J O Toole
(74) *Attorney, Agent, or Firm* — Banner & Witcoff, Ltd.

(57) ABSTRACT

The present application discloses a power-on-reset circuit, which optimizes a hysteresis circuit and a reset signal generation circuit, and introduces a seventh PMOS transistor as a switch transistor to achieve the differentiation of control voltages at a gate end of a first NMOS transistor during powering-on and off. A voltage rise detection point is determined by a partial voltage of a resistor during powering-on, while a voltage fall detection point is directly determined by a power supply voltage during powering-off. Such differentiation may achieve a significant separation between the voltage rise detection point and the voltage fall detection point, reducing the voltage fall detection point to near a threshold voltage of the first NMOS transistor, and meeting the demand for a lower voltage fall detection point, which is consistent with a practical application of the power-on-reset circuit in an MCU.

10 Claims, 2 Drawing Sheets

FIG. 1 --Prior Art--

POWER-ON-RESET CIRCUIT

CROSS-REFERENCE TO RELATED APPLICATIONS

This application claims priority to Chinese patent application No. 202211273910.8 filed on Oct. 18, 2022, the disclosure of which is incorporated herein by reference in its entirety.

TECHNICAL FIELD

The present application relates to CMOS integrated circuit technologies, in particular to a power-on-reset circuit used in a Microcontroller Unit (MCU).

BACKGROUND

A Power-On-Reset (POR) circuit is often used for power-on detection in a Microcontroller Unit (MCU). During powering-on, the POR circuit provides a reset signal (RESET) to an internal digital module of a chip to ensure that the chip always starts working in a determined state.

An existing power-on-reset circuit is shown in FIG. 1, which includes a hysteresis circuit A, a reset signal generation circuit B, and a sampling delay and discharge circuit C. A main principle of the circuit is follows:

During powering-on, a voltage (i.e., a partial voltage of a first resistor R1 and a second resistor R2) of a VN node increases. As a power supply voltage increases, a first NMOS transistor NM1 gradually becomes conductive, a voltage of a V1 node is pulled down, and a voltage of a V2 node decreases simultaneously, making a sixth PMOS transistor PM6 conductive. A fourth PMOS transistor PM4 mirrors a branch current of a first PMOS transistor PM1 to charge a reset capacitor CAP. A voltage V0 of an upper plate of the reset capacitor CAP gradually increases. A voltage of the reset signal RESET increases initially following the power supply voltage VDD. When the voltage V0 of the upper plate of the reset capacitor CAP is sufficiently high, an inverter INV with an input end connected to the upper plate of the reset capacitor CAP is inverted, and the reset signal RESET is set from a high level to a low level. When the reset signal RESET is inverted, the corresponding power supply voltage VDD is a voltage rise detection point (Vrise). A high-level width of the reset signal RESET is a pulse width of the reset signal RESET.

When the power supply voltage drops, the voltage of the VN node also drops accordingly. As the voltage of the V2 node decreases, a fifth PMOS transistor PM5 also becomes conductive, and a branch current of a second PMOS transistor PM2 also flows to the first resistor R1 and the second resistor R2, thereby increasing the voltage of the VN node. A voltage of a VP node also increases, resulting in a decrease in a current of a third PMOS transistor PM3. As such, the voltage of the VN node drops to a lower value, causing the voltage of the V1 node to recover to high, which introduces a window. When the voltage of the V1 node increases, causing the voltage of the V2 node to be inverted to the high, a second NMOS transistor NM2 may become conductive. When the voltage V0 of the upper plate of the reset capacitor CAP decreases due to the discharge through the second NMOS transistor NM2, the reset signal RESET is inverted again to the power supply voltage VDD, and changes following the power supply voltage. In this case, the corresponding power supply voltage is a voltage fall detection point (Vfall). A difference between the voltage rise and fall detection points is a hysteresis voltage.

The hysteresis circuit A in the overall circuit generates a hysteresis voltage by introducing the fifth PMOS transistor PM5. The reset signal generation circuit B generates a signal to control the sampling delay and discharge circuit C to perform charge and discharge, where a charge process corresponds to a signal delay. Such delay may enable the MCU to start working at a sufficiently high voltage during powering-on. Such circuit structure may ensure the generation of a detection hysteresis voltage. The pulse width of the reset signal RESET may be flexibly adjusted by adjusting the capacitance of the reset capacitor and a charge current. Moreover, when powering-off and powering-on with the power supply voltage are performed in a short period of time, the circuit may still generate the reset signal RESET correctly.

In practical use of the MCU, a primary power-on-reset (POR) circuit is a module started firstly in the system. The voltage rise detection point is typically set above 1.6 V. After the power supply voltage exceeds this value, a digital module starts a reset process subsequently to ensure the working in the determined state. The functions of the circuit such as undervoltage protection and power-off detection are implemented by other circuit modules. The voltage fall detection point of the POR circuit is set relatively low, typically set to a threshold voltage (about 500 mV) of a MOS transistor.

Regarding the circuit structure in FIG. 1, due to the fast discharge of the reset capacitor, the voltage fall detection point is approximately the voltage (approximately a threshold voltage of the first NMOS transistor NM1) of the VN node that causes the voltage of the V2 node to be inverted, plus a source drain voltage VDS of the first PMOS transistor PM1. Under the condition of controlling the power consumption and area and ensuring the current mirror saturation, the impedance of the first PMOS transistor PM1 is of a similar magnitude with resistances of lower resistors, and the source drain voltage VDS is typically several hundred millivolts. Therefore, the voltage fall detection point is generally above 1 V in the circuit structure of FIG. 1, which is difficult to reach a threshold voltage level, thereby posing significant limitations to the practical application of the circuit in FIG. 1.

BRIEF SUMMARY

The technical problem to be solved by the present application is to provide a power-on-reset circuit, which may achieve a significant separation between a voltage rise detection point and a voltage fall detection point, reducing the voltage fall detection point to near a threshold voltage of an NMOS transistor, and meeting the demand for a lower voltage fall detection point.

To solve the above technical problem, the power-on-reset circuit provided by the present application includes a first PMOS transistor PM1, a third PMOS transistor PM3, a fourth PMOS transistor PM4, a fifth PMOS transistor PM5, a sixth PMOS transistor PM6, a seventh PMOS transistor PM7, a first NMOS transistor NM1, a second NMOS transistor NM2, a first resistor R1, a second resistor R2, a first inverter INV1, a second inverter INV2, a third inverter INV3, and a reset capacitor CAP.

Source ends of the first PMOS transistor PM1, the third PMOS transistor PM3, the fourth PMOS transistor PM4, and the fifth PMOS transistor PM5 are all connected to a power supply voltage VDD.

A gate end and a drain end of the first PMOS transistor PM1, a gate end of the third PMOS transistor PM3, and a gate end of the fourth PMOS transistor PM4 are all connected to a VP node.

The first resistor R1 and the second resistor R2 are connected in series between the VP node and the ground GND sequentially.

A drain end of the third PMOS transistor PM3, a drain end of the first NMOS transistor NM1, and an input end of the first inverter INV1 are all connected to a V1 node.

An input end of the second inverter INV2 is connected to an output end V1B of the first inverter INV1.

An output end of the second inverter INV2, a gate end of the fifth PMOS transistor PM5, a gate end of the sixth PMOS transistor PM6, and a gate end of the second NMOS transistor NM2 are all connected to a V2 node.

A drain end of the fifth PMOS transistor PM5, a source end of the seventh PMOS transistor PM7, and a gate end of the first NMOS transistor NM1 are all connected to a VN node.

A gate end of the seventh PMOS transistor PM7 is connected to the output end V1B of the first inverter INV1, and a drain end of same is connected to a series connection point between the first resistor R1 and the second resistor R2.

A source end of the first NMOS transistor NM1 and a source end of the second NMOS transistor NM2 are both connected to the ground GND.

A source end of the sixth PMOS transistor PM6 is connected to a drain end of the fourth PMOS transistor PM4.

A drain end of the sixth PMOS transistor PM6 is connected to a drain end of the second NMOS transistor NM2 and an input end of the third inverter INV3.

Two ends of the reset capacitor CAP are connected to the drain end of the sixth PMOS transistor PM6 and the ground GND respectively.

An output end of the third inverter INV3 is used to output a reset signal RESET.

In an example, a source drain on-resistance of the fifth PMOS transistor PM5 is less than a source drain on-resistance of each of the first PMOS transistor PM1, the third PMOS transistor PM3, the fourth PMOS transistor PM4, and the sixth PMOS transistor PM6.

In an example, a source drain on-resistance of the seventh PMOS transistor PM7 is less than a source drain on-resistance of each of the first PMOS transistor PM1, the third PMOS transistor PM3, the fourth PMOS transistor PM4, and the sixth PMOS transistor PM6.

In an example, a source drain on-resistance of the fifth PMOS transistor PM5 is less than 2 KΩ.

In an example, a source drain on-resistance resistance of first PMOS transistor PM1 and resistances of the first resistor R1 and second resistor R2 are of the same magnitude.

In an example, resistances of the first resistor R1 and the second resistor R2 are 10 KΩ-10 MΩ.

In an example, a resistance of the second resistor R2 is a positive integral multiple of that of the first resistor R1.

In an example, a process parameter of the fourth PMOS transistor PM4 is the same as that of the first PMOS transistor PM1.

In an example, the reset capacitor CAP is a MOS capacitor, a MOM capacitor, or a variable capacitor.

In an example, a capacitance of the reset capacitor CAP is 0.01-100 pF.

The power-on-reset circuit of the present application optimizes a hysteresis circuit A and a reset signal generation circuit B, and introduces the seventh PMOS transistor PM7 as a switch transistor to achieve the differentiation of control voltages (voltage rise and fall detection points) of the gate end of the first NMOS transistor NM1 during powering-on and off. A voltage rise detection point is determined by a partial voltage of the resistor during powering-on, while a voltage fall detection point is directly determined by the power supply voltage VDD during powering-off. Such differentiation may achieve a significant separation (hysteresis voltage>1 V) between the voltage rise detection point and the voltage fall detection point, reducing the voltage fall detection point to near a threshold voltage (about 500 mV) of the first NMOS transistor NM1, and meeting the demand for a lower voltage fall detection point, which is consistent with a practical application of the power-on-reset (POR) circuit in an MCU.

BRIEF DESCRIPTION OF THE DRAWINGS

In order to more clearly explain the technical solutions of the present application, the drawings required by the present application will be briefly described below. It is obvious that the drawings described below are merely some embodiments of the present application, and those skilled in the art could also obtain other drawings on the basis of these drawings without the practice of inventive effort.

DETAILED DESCRIPTION OF THE DISCLOSURE

The technical solutions in the embodiments of the present application will be clearly and completely described below in conjunction with the drawings. Obviously, the described embodiments are only part of the embodiments of the present application, rather than all of the embodiments. Based on the embodiments in the present application, all other embodiments obtained by those skilled in the art without the practice of inventive effort shall fall into the protection scope of the present application.

The terms such as "first" and "second" used in the present application do not indicate any order, quantity, or importance, but are only used to distinguish different constituent parts. The terms such as "include" or "comprise" means that the components or objects in front of these terms cover the components or objects listed after the terms and equivalents thereof, without excluding other components or objects. The terms such as "connection" or "coupling" are not limited to physical or mechanical connections, but may include electrical connections, whether direct or indirect. The terms "up", "down", "left", "right", etc. are only used to represent relative positional relationships, which may change accordingly after absolute positions of the described objects change.

It should be noted that the embodiments or features in the embodiments of the present application may be combined with each other in the case of no conflict.

Embodiment 1

Figure 2:
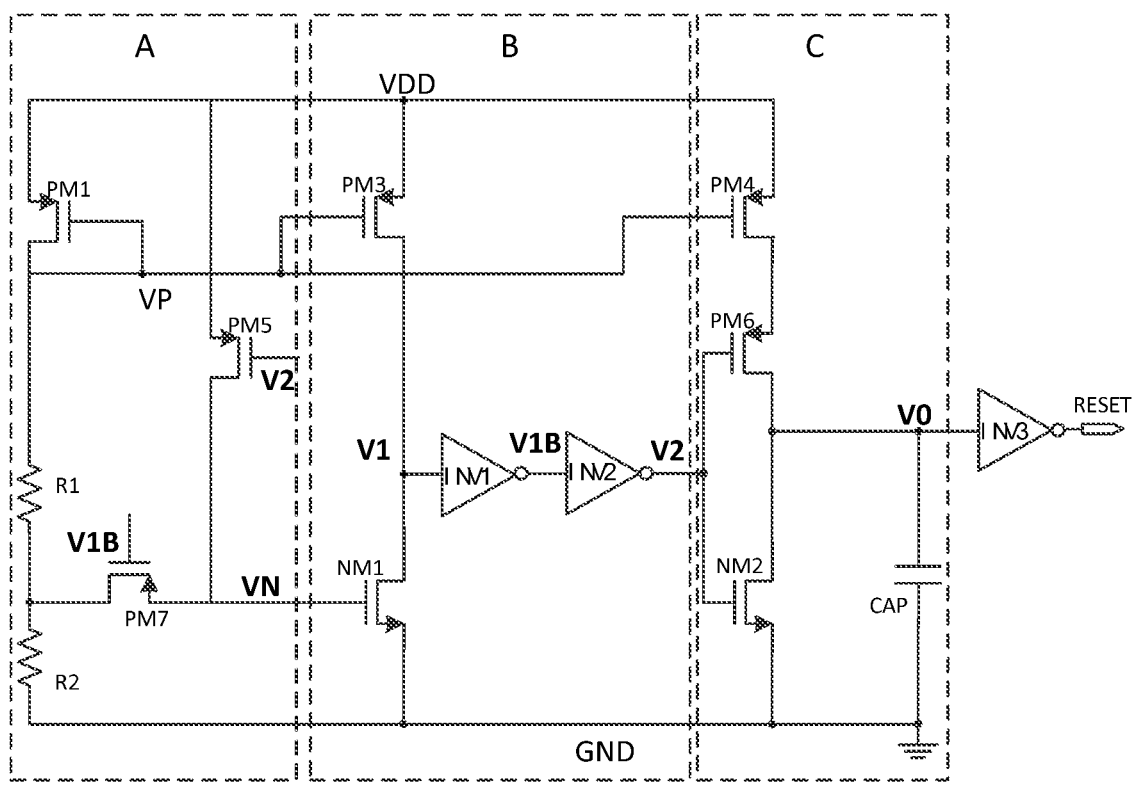
FIG. 2 illustrates an embodiment of a power-on-reset circuit according to the present application.

Referring to FIG. 2, a power-on-reset circuit includes a first PMOS transistor PM1, a third PMOS transistor PM3, a fourth PMOS transistor PM4, a fifth PMOS transistor PM5, a sixth PMOS transistor PM6, a seventh PMOS transistor PM7, a first NMOS transistor NM1, a second NMOS transistor NM2, a first resistor R1, a second resistor R2, a first inverter INV1, a second inverter INV2, a third inverter INV3, and a reset capacitor CAP.

Source ends of the first PMOS transistor PM1, the third PMOS transistor PM3, the fourth PMOS transistor PM4, and the fifth PMOS transistor PM5 are all connected to a power supply voltage VDD.

A gate end and a drain end of the first PMOS transistor PM1, a gate end of the third PMOS transistor PM3, and a gate end of the fourth PMOS transistor PM4 are all connected to a VP node.

The first resistor R1 and the second resistor R2 are connected in series between the VP node and the ground GND sequentially.

A drain end of the third PMOS transistor PM3, a drain end of the first NMOS transistor NM1, and an input end of the first inverter INV1 are all connected to a V1 node.

An input end of the second inverter INV2 is connected to an output end V1B of the first inverter INV1.

An output end of the second inverter INV2, a gate end of the fifth PMOS transistor PM5, a gate end of the sixth PMOS transistor PM6, and a gate end of the second NMOS transistor NM2 are all connected to a V2 node.

A drain end of the fifth PMOS transistor PM5, a source end of the seventh PMOS transistor PM7, and a gate end of the first NMOS transistor NM1 are all connected to a VN node.

A gate end of the seventh PMOS transistor PM7 is connected to the output end V1B of the first inverter INV1, and a drain end of same is connected to a series connection point between the first resistor R1 and the second resistor R2.

A source end of the first NMOS transistor NM1 and a source end of the second NMOS transistor NM2 are both connected to the ground GND.

A source end of the sixth PMOS transistor PM6 is connected to a drain end of the fourth PMOS transistor PM4.

A drain end of the sixth PMOS transistor PM6 is connected to a drain end of the second NMOS transistor NM2 and an input end of the third inverter INV3.

Two ends of the reset capacitor CAP are connected to the drain end of the sixth PMOS transistor PM6 and the ground GND respectively.

An output end of the third inverter INV3 is used to output a reset signal RESET.

Figure 1:
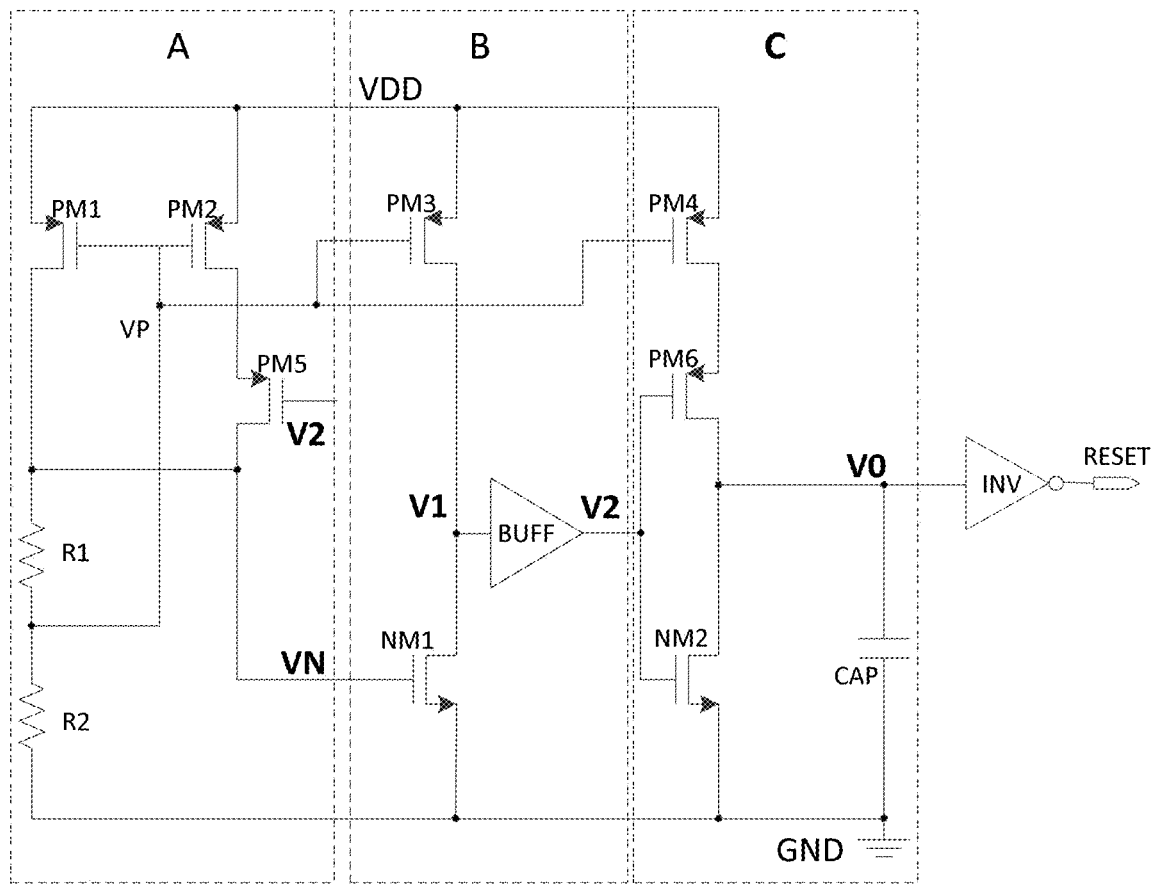
FIG. 1 illustrates a structure of an existing power-on-reset circuit.

In the power-on-reset circuit of Embodiment 1, the gate end of the first NMOS transistor NM1 is connected to a serial connection end of the second resistor R2 by means of the seventh PMOS transistor PM7, a V1 node signal is processed and output as an inversion signal by the output end V1B of the first inverter INV1, so as to control the seventh PMOS transistor PM7. The fifth PMOS transistor PM5 is directly connected to the power supply voltage VDD, and the first PMOS transistor PM1 is self-biased to generate a branch current. A specific implementation mechanism is as follows:

During powering-on, a voltage of the V1 node increases with the power supply voltage VDD. A voltage of the output end V1B of the first inverter INV1 remains low, the seventh PMOS transistor PM7 remains conductive, and a voltage of the V2 node remains high and increases with the power supply voltage VDD, the fifth PMOS transistor PM5 cuts off. In this case, a voltage of the VN node is a partial voltage of the second resistor R2 in a branch of the first PMOS transistor PM1—the first resistor R1—the second resistor R2. When the power supply voltage VDD is sufficiently high, the partial voltage of the second resistor R2 is relatively high, making the first NMOS transistor NM1 conductive, the voltage of the V1 node is pulled down to the ground voltage gradually, and the voltage of the V2 node is set to low. A branch of the fourth PMOS transistor PM4—the sixth PMOS transistor PM6 starts charging the reset capacitor CAP, and a voltage of the reset signal RESET initially increases following the power supply voltage VDD, when a voltage V0 of an upper plate of the reset capacitor CAP is sufficiently high, the reset signal RESET is inverted to a low level, the power supply voltage VDD in this case is a voltage rise detection point. Such process is similar to a situation of the structure in FIG. 1.

During powering-off with the power supply voltage VDD decreasing from a high voltage, the voltage of the V1 node is set low initially, and the voltage of the V2 node is also set low. The voltage of the output end V1B of the first inverter INV1 follows the power supply voltage VDD. In this case, the fifth PMOS transistor PM5 is still conductive, and the voltage of the VN node changes following the power supply voltage VDD. A gate source voltage $V_{GS}$ of the seventh PMOS transistor PM7 is about 0, and the seventh PMOS transistor PM7 thus cannot be conductive. The voltage of the VN node is greater than a voltage of the serial connection end of the second resistor R2. In this case, a conduction situation of the first NMOS transistor NM1 is not affected by the partial voltage of the resistor, but is directly affected by the power supply voltage VDD. By designing the size of the fifth PMOS transistor PM5 such that the fifth PMOS transistor PM5 has a relatively small on-resistance, a gate voltage of the first NMOS transistor NM1 may be approximately equal to the power supply voltage VDD.

The power-on-reset circuit of Embodiment 1 introduces the seventh PMOS transistor PM7. a control signal of the seventh PMOS transistor PM7 is controlled by A reverse phase of a drain end voltage of the first NMOS transistor NM1. Conduction situations of the first NMOS tube NM1 during powering-on and off are different. During powering-on with the power supply voltage VDD increasing from 0, the voltage of the V1 node is high initially, and the voltage of the output end V1B of the first inverter INV1 is low, in this case, the seventh PMOS transistor PM7 is conductive, and the gate voltage of the first NMOS transistor NM1 is $VDD*R2/(R1+R2+R_{ds})$, $R_{ds}$ being the source drain on-resistance of the first PMOS transistor PM1. During powering-off with the power supply voltage decreasing from the high voltage, the voltage of the V1 node is low initially, and the voltage of the output end V1B of the first inverter INV1 is high, in this case, the seventh PMOS transistor PM7 cuts off, and the gate voltage of the first NMOS transistor NM1 is approximately the power supply voltage VDD. Therefore, the power-on-reset circuit can ensure that when the power supply voltage VDD is near a threshold voltage (about 500 mV) of the first NMOS transistor NM1, the voltage of the V1 node increases to the power supply voltage VDD, causing the reset signal RESET signal to be inverted subsequently, and thereby achieving a very low voltage fall detection point.

The power-on-reset circuit of Embodiment 1 optimizes a hysteresis circuit A and a reset signal generation circuit B, and introduces the seventh PMOS transistor PM7 as a switch transistor to achieve the differentiation of control voltages (voltage rise and fall detection points) of the gate end of the first NMOS transistor NM1 during powering-on and off. The voltage rise detection point is determined by a partial voltage of the resistor during powering-on, while the voltage fall detection point is directly determined by the power supply voltage VDD during powering-off. Such differentiation may achieve a significant separation (hysteresis voltage>1 V) between the voltage rise detection point and the voltage fall detection point, reducing the voltage fall detection point to near the threshold voltage (about 500 mV) of the first NMOS transistor NM1, and meeting the demand for a lower voltage fall detection point, which is consistent with a practical application of the power-on-reset (POR) circuit in an MCU.

Embodiment 2

In the power-on-reset circuit based on Embodiment 1, a source drain on-resistance of the fifth PMOS transistor PM5 is less than a source drain on-resistance of each of the first PMOS transistor PM1, the third PMOS transistor PM3, the fourth PMOS transistor PM4, and the sixth PMOS transistor PM6.

In an example, a source drain on-resistance of the seventh PMOS transistor PM7 is less than a source drain on-resistance of each of the first PMOS transistor PM1, the third PMOS transistor PM3, the fourth PMOS transistor PM4, and the sixth PMOS transistor PM6.

In an example, a source drain on-resistance of the fifth PMOS transistor PM5 is less than 2 KΩ.

In an example, a source drain on-resistance resistance of first PMOS transistor PM1 and resistances of the first resistor R1 and second resistor R2 are of the same magnitude.

In an example, resistances of the first resistor R1 and the second resistor R2 are 10 KΩ-10 MΩ.

In an example, a resistance of the second resistor R2 is a positive integral multiple of that of the first resistor R1.

In an example, a process parameter of the fourth PMOS transistor PM4 is the same as that of the first PMOS transistor PM1.

In an example, the reset capacitor CAP is a MOS capacitor, a MOM capacitor, or a variable capacitor.

In an example, a capacitance of the reset capacitor CAP is 0.01-100 pF.

In the power-on-reset circuit of Embodiment 2, the resistance of the second resistor R2 may be adjusted to change the partial voltage so as to further adjust the voltage rise detection point, and the voltage fall detection point may be controlled at a low voltage. In addition, a pulse width of the reset signal RESET may be adjusted flexibly, achieving high design flexibility and thereby expanding an application range of the existing circuit.

The power-on-reset circuit of the present application is applied in the design of a 40 nm-process embedded flash (EF) platform. After Virtuoso simulation verification, it is found that the voltage fall detection point is about 0.5 V, and the voltage rise detection point is about 1.6 V. This circuit can achieve flexible adjustment of the voltage rise and fall detection points, and the pulse width of the reset signal RESET, etc., and can identify an action of powering-on and off in a short period of time (2 μs), such that the reset signal RESET can respond correctly.

A simulation comparison between the existing power-on-reset circuit and the improved power-on-reset circuit provided in the present application is performed. A simulation condition includes slow powering-on and off (10 ms powering-on) at three corners TT, FF, and SS under normal temperature and pressure (25° C., 2.5 V). The voltage rise and fall detection points can be determined by reading the power supply voltage at a moment of an abrupt change of the reset signal RESET. Results of the voltage detection points at different corners are summarized in Table 1. Upon comparison, it can be seen that the voltage fall detection points in the existing power-on-reset circuit are all greater than 1 V (approximately the sum of the threshold voltage of the first NMOS transistor NM1 and the source drain voltage $V_{DS}$ of the first PMOS transistor PM1); the voltage fall detection points of all the corners in the improved power-on-reset circuit provided by the present application are about 0.5V (approximately the threshold voltage of the first NMOS transistor NM1).

TABLE 1

| Corner | Existing power-on-reset circuit | | Power-on-reset circuit of the present application | |
|---|---|---|---|---|
| | Voltage rise detection point (V) | Voltage fall detection point (V) | Voltage rise detection point (V) | Voltage fall detection point (V) |
| TT | 1.67 | 1.18 | 1.63 | 0.52 |
| FF | 1.6 | 1.11 | 1.56 | 0.47 |
| SS | 1.75 | 1.26 | 1.71 | 0.56 |

The above description is merely examples of the embodiments of the present application and is not intended to limit the present application. Any modifications, equivalent substitutions, and improvements, etc. made within the spirit and principles of the present application shall be included within the protection scope of the present application.

What is claimed is:

1. A power-on-reset circuit, comprising a first PMOS transistor (PM1), a third PMOS transistor (PM3), a fourth PMOS transistor (PM4), a fifth PMOS transistor (PM5), a sixth PMOS transistor (PM6), a seventh PMOS transistor (PM7), a first NMOS transistor (NM1), a second NMOS transistor (NM2), a first resistor (R1), a second resistor (R2), a first inverter (INV1), a second inverter (INV2), a third inverter (INV3), and a reset capacitor (CAP); wherein
source ends of the first PMOS transistor (PM1), the third PMOS transistor (PM3), the fourth PMOS transistor (PM4), and the fifth PMOS transistor (PM5) are all connected to a power supply voltage (VDD);
a gate end and a drain end of the first PMOS transistor (PM1), a gate end of the third PMOS transistor (PM3), and a gate end of the fourth PMOS transistor (PM4) are all connected to a VP node;
the first resistor (R1) and the second resistor (R2) are connected in series between the VP node and a ground (GND) sequentially;
a drain end of the third PMOS transistor (PM3), a drain end of the first NMOS transistor (NM1), and an input end of the first inverter (INV1) are all connected to a V1 node;
an input end of the second inverter (INV2) is connected to an output end (V1B) of the first inverter (INV1);
an output end of the second inverter (INV2), a gate end of the fifth PMOS transistor (PM5), a gate end of the sixth PMOS transistor (PM6), and a gate end of the second NMOS transistor (NM2) are all connected to a V2 node;
a drain end of the fifth PMOS transistor (PM5), a source end of the seventh PMOS transistor (PM7), and a gate end of the first NMOS transistor (NM1) are all connected to a VN node;
a gate end of the seventh PMOS transistor (PM7) is connected to the output end (V1B) of the first inverter (INV1), and a drain end of the seventh PMOS transistor (PM7) is connected to a serial connection point between the first resistor (R1) and the second resistor (R2);

a source end of the first NMOS transistor (NM1) and a source end of the second NMOS transistor (NM2) are both connected to the ground (GND);

a source end of the sixth PMOS transistor (PM6) is connected to a drain end of the fourth PMOS transistor (PM4);

a drain end of the sixth PMOS transistor (PM6) is connected to a drain end of the second NMOS transistor (NM2) and an input end of the third inverter (INV3);

two ends of the reset capacitor (CAP) are connected to the drain end of the sixth PMOS transistor (PM6) and the ground (GND) respectively; and an output end of the third inverter (INV3) is used to output a reset signal (RESET).

2. The power-on-reset circuit according to claim 1, wherein a source drain on-resistance of the fifth PMOS transistor (PM5) is less than a source drain on-resistance of each of the first PMOS transistor (PM1), the third PMOS transistor (PM3), the fourth PMOS transistor (PM4), and the sixth PMOS transistor (PM6).

3. The power-on-reset circuit according to claim 1, wherein a source drain on-resistance of the seventh PMOS transistor (PM7) is less than a source drain on-resistance of each of the first PMOS transistor (PM1), the third PMOS transistor (PM3), the fourth PMOS transistor (PM4), and the sixth PMOS transistor (PM6).

4. The power-on-reset circuit according to claim 1, wherein a source drain on-resistance of the fifth PMOS transistor (PM5) is less than 2 KΩ.

5. The power-on-reset circuit according to claim 1, wherein a source drain on-resistance resistance of first PMOS transistor (PM1) and resistances of the first resistor (R1) and the second resistor (R2) are of a same magnitude.

6. The power-on-reset circuit according to claim 1, wherein resistances of the first resistor (R1) and the second resistor (R2) are 10 KΩ-10 MΩ.

7. The power-on-reset circuit according to claim 1, wherein a resistance of the second resistor (R2) is a positive integral multiple of a resistance of the first resistor (R1).

8. The power-on-reset circuit according to claim 1, wherein a process parameter of the fourth PMOS transistor (PM4) is the same as a process parameter of the first PMOS transistor (PM1).

9. The power-on-reset circuit according to claim 1, wherein the reset capacitor (CAP) is a MOS capacitor, a MOM capacitor, or a variable capacitor.

10. The power-on-reset circuit according to claim 1, wherein a capacitance of the reset capacitor (CAP) is 0.01-100 pF.

* * * * *